(12) United States Patent
Jang et al.

(10) Patent No.: US 12,710,465 B2
(45) Date of Patent: Aug. 18, 2026

(54) PARTIAL DISCHARGE MONITORING SYSTEM AND PARTIAL DISCHARGE MONITORING METHOD

(71) Applicant: LS CABLE & SYSTEM LTD., Anyang-si (KR)

(72) Inventors: Kyung Hoon Jang, Songpa-gu (KR); Sung Ik Shim, Gangnam-gu (KR); Sung Yun Kim, Suseong-gu (KR); Dae Jin Park, Gumi-si (KR); Hyeon Seok Lee, Yongin-si (KR); Kuniaki Sakamoto, Gumi-si (KR)

(73) Assignee: LS CABLE & SYSTEM LTD., Anyang-si (KR)

( * ) Notice: Subject to any disclaimer, the term of this patent is extended or adjusted under 35 U.S.C. 154(b) by 160 days.

(21) Appl. No.: 18/724,583

(22) PCT Filed: Dec. 29, 2022

(86) PCT No.: PCT/KR2022/021641
§ 371 (c)(1),
(2) Date: Jun. 26, 2024

(87) PCT Pub. No.: WO2023/128669
PCT Pub. Date: Jul. 6, 2023

(65) Prior Publication Data

US 2025/0102555 A1 Mar. 27, 2025

(30) Foreign Application Priority Data

Dec. 30, 2021 (KR) ........................ 10-2021-0192238
Dec. 28, 2022 (KR) ........................ 10-2022-0187472

(51) Int. Cl.
*G01R 31/12* (2020.01)
*G06F 18/23213* (2023.01)

(52) U.S. Cl.
CPC ... *G01R 31/1272* (2013.01); *G06F 18/23213* (2023.01)

(58) Field of Classification Search
None
See application file for complete search history.

(56) References Cited

U.S. PATENT DOCUMENTS

2008/0088314 A1* 4/2008 Younsi .............. G01R 31/1227 324/457
2016/0061897 A1 3/2016 Kwon et al.
(Continued)

FOREIGN PATENT DOCUMENTS

CN 109239553 A 1/2019
CN 112763871 A 5/2021
(Continued)

OTHER PUBLICATIONS

International Search Report for related International Application No. PCT/KR2022/021641; action dated Jul. 6, 2023; (2 pages).
(Continued)

*Primary Examiner* — Jas A Sanghera
(74) *Attorney, Agent, or Firm* — K&L Gates LLP

(57) ABSTRACT

The present disclosure relates to a partial discharge monitoring system and a partial discharge monitoring method that are capable of monitoring and determining a defect generated in a high-voltage power device in real time by pattern recognizing signals generated from the high-voltage power device with a machine learning algorithm being applied.

6 Claims, 14 Drawing Sheets

(56) References Cited

U.S. PATENT DOCUMENTS

2022/0147777 A1* 5/2022 Guo .................. G06F 18/24137
2025/0123315 A1* 4/2025 Jang ....................... G01R 22/06

FOREIGN PATENT DOCUMENTS

KR 20100048650 A 5/2010
KR 101350529 B1 1/2014
KR 101385318 B1 4/2014
KR 101822829 B1 1/2018
KR 20210118707 A 10/2021

OTHER PUBLICATIONS

Written Opinion for related International Application No. PCT/KR2022/021641; action dated Jul. 6, 2023; (4 pages).
Office Action for related Korean Application No. 10-2022-0187472 action dated Apr. 1, 2026; (9 pages).

* cited by examiner (a)

(b)

43

| 0 | 0 | 0 | 0 | 0 | 0 |
|---|---|---|---|---|---|
| 181 | 189 | 169 | 182 | 177 | 169 |
| 10 | 4 | 6 | 11 | 30 | 4 |
| 1 | 0 | 0 | 2 | 0 | 1 |
| 0 | 1 | 0 | 0 | 0 | 0 |
| 0 | 0 | 0 | 0 | 0 | 0 |
| 0 | 0 | 0 | 0 | 0 | 0 |
| 0 | 0 | 0 | 0 | 0 | 0 |

* EACH CELL VALUE IS NUMBER OF TIMES OF PULSE OCCURRENCE OF PARTIAL DISCHARGE SIGNAL

| 0 | 0 | 0 | 0 | 0 | 0 |
|---|---|---|---|---|---|
| 1 | 1 | 1 | 1 | 1 | 1 |
| 1 | 1 | 1 | 1 | 1 | 1 |
| 1 | 0 | 0 | 1 | 0 | 1 |
| 0 | 1 | 0 | 0 | 0 | 0 |
| 0 | 0 | 0 | 0 | 0 | 0 |
| 0 | 0 | 0 | 0 | 0 | 0 |
| 0 | 0 | 0 | 0 | 0 | 0 |

* AFTER PREPROCESSING

| 0 | 0 | 0 | 0 | 0 | 0 |
|---|---|---|---|---|---|
| 178 | 188 | 178 | 160 | 166 | 177 |
| 34 | 4 | 64 | 35 | 0 | 111 |
| 3 | 6 | 0 | 3 | 0 | 22 |
| 0 | 4 | 25 | 0 | 0 | 10 |
| 0 | 2 | 1 | 0 | 0 | 2 |
| 0 | 0 | 0 | 0 | 0 | 1 |
| 0 | 0 | 0 | 0 | 0 | 0 |

shift shift

* EACH CELL VALUE IS NUMBER OF TIMES OF PULSE OCCURRENCE OF PARTIAL DISCHARGE SIGNAL

| 0 | 0 | 0 | 0 | 0 | 0 |
|---|---|---|---|---|---|
| 166 | 177 | 178 | 188 | 178 | 160 |
| 0 | 111 | 34 | 4 | 64 | 35 |
| 0 | 22 | 3 | 6 | 0 | 3 |
| 0 | 10 | 0 | 4 | 25 | 0 |
| 0 | 2 | 0 | 2 | 1 | 0 |
| 0 | 1 | 0 | 0 | 0 | 0 |
| 0 | 0 | 0 | 0 | 0 | 0 |

* AFTER PREPROCESSING (PULSE MAGNITUDE OF PARTIAL DISCHARGE SIGNAL)
X-AXIS

Y-AXIS (PHASE ANGLE)

PARTIAL DISCHARGE MONITORING SYSTEM AND PARTIAL DISCHARGE MONITORING METHOD

CROSS-REFERENCE TO RELATED APPLICATIONS

The present application is a National Stage of International Application No. PCT/KR2022/021641, filed on Dec. 29, 2022, which claims priority to Korean Application No. 10-2021-0192238, filed Dec. 30, 2021, and Korean Application No. 10-2022-0187472, filed Dec. 28, 2022, the entire contents of each hereby incorporated by reference.

FIELD

The present disclosure relates to a partial discharge monitoring system and a partial discharge monitoring method. More specifically, the present disclosure relates to a partial discharge monitoring system and a partial discharge monitoring method that are capable of monitoring and determining a defect generated in a high-voltage power device in real time by obtaining a partial discharge signal generated from the high-voltage power device with a machine learning algorithm being applied and recognizing patterns of PRPD data after obtaining the PRPD data.

BACKGROUND

When a high-voltage power device is installed and operated in a power system, various types of accidents may occur due to various causes, and the scale of damage resulting from accidents is also on the rise. Accordingly, various diagnostic techniques and advanced devices are being applied to detect and diagnose partial discharge signals inside the high-voltage power device before an accident occurs.

Among these, a partial discharge (PD) measurement may be a method to determine whether a power device is abnormal. In general, it is possible to diagnose, through pattern recognition of a machine learning algorithm, which defect a signal generated in a power device is caused by using an artificial neural network after a phase resolved partial discharge (PRPD) analysis, and determine whether a partial discharge has occurred according to a defect in the power device.

In the related art, an operator installs a sensor for partial discharge measurement in the field to determine the partial discharge and the like of a power device and then obtains data to determine the partial discharge. However, as a partial discharge phenomenon occurring in a cable is irregular and intermittent, a signal measurement is possible only while the operator stays in the field, which creates a limitation in determining the partial discharge.

In addition, since the PRPD analysis interprets the partial discharge data on the basis of a phase, it is possible to perform an accurate analysis only when the voltage phase of the power device such as a cable is known. However, since it is not easy to accurately measure the voltage phase of the power device in an active state, the PRPD analysis is attempted using the current phase of the power device or the AC voltage phase of a commercial power source used in a partial discharge measurement device instead of the voltage phase of the power device. In this case, since there exists a phase difference from the voltage phase of the power device, there was a problem that the determination result was inaccurate when the partial discharge pattern recognition was performed in a state of not identifying the voltage phase of the power device.

Therefore, there is a need for a partial discharge monitoring system and a partial discharge monitoring method that is capable of monitoring and determining a defect occurring in a high-voltage power device in real time by pattern recognizing a partial discharge signal generated in the high-voltage power device with no information on the voltage phase of the high-voltage power device.

SUMMARY

The present disclosure has been made an effort to solve the problem of providing a partial discharge monitoring system and a partial discharge monitoring method that are capable of monitoring and determining a defect generated in a high-voltage power device in real time by pattern recognizing signals generated from the high-voltage power device on the basis of a current phase of the high-voltage power device or a voltage phase of a commercial power source and information on the phase of occurrence of the signal based thereon, and a pulse magnitude of the signal.

To solve the aforementioned objects, the present disclosure: is directed to providing a partial discharge monitoring method including: a signal measurement step of measuring signals of a high-voltage power device and obtaining pulse waveforms of the signals; a signal separation step of extracting feature dots from the pulse waveforms and generating two-dimensional feature dot data using the feature dots; a signal clustering step of clustering feature dot points corresponding to the feature dots on the two-dimensional feature dot data according to density to classify the feature dot points as feature dot data clusters, and obtaining phase resolved partial discharge (PRPD) data for the feature dot data clusters; and a partial discharge determination step diagnosing the signals by recognizing patterns of the PRPD data and determining whether a partial discharge of the power device has occurred on the basis of the diagnosis result.

In this case, the feature dots may include shape parameters of pulses and bandwidths of the pulses into which the pulse waveforms are converted in a frequency domain.

In addition, in the signal clustering step, the feature dot points may be clustered on the basis of density corresponding to the number of feature dot points present within a preset radius with respect to a specific feature dot point on the two-dimensional feature dot data obtained in the signal separation step.

In addition, the pattern recognition of the PRPD data may be made based on a current phase of the high-voltage power device or a voltage phase of a commercial power source and information on the phase of occurrence of the signal based thereon, and a pulse magnitude of a partial discharge signal.

Further, in the partial discharge determination step, the diagnosed signal may be diagnosed as a normal signal when the diagnosed signal is a corona discharge signal or a noise signal, and the diagnosed signal may be diagnosed as a partial discharge signal when the diagnosed signal is an internal discharge signal or a surface discharge signal to determine that a partial discharge has occurred due to a defect in the power device.

In addition, to solve the aforementioned objects, the present disclosure is directed to providing a partial discharge monitoring system including: a signal detection unit provided with a sensor to detect signals of a power device; a local unit configured to transmit the signals detected by the signal detection unit through a communication network; and a main unit configured to apply a machine learning algorithm to extract feature dots from the signals transmitted through the local unit, generate feature dot points corresponding to the extracted feature dots, and classify the feature dot points into feature dot data clusters according to density to determine whether a partial discharge has occurred.

Here, the main unit may include: a signal separation unit configured to extract feature dots from pulse waveforms of the signals transmitted through the local unit, and generate two-dimensional feature dot data using the feature dots; a signal clustering unit configured to cluster feature dot points on the two-dimensional feature dot data generated by the signal separation unit according to density to classify the feature dot points as feature dot data clusters, and generate phase resolved partial discharge (PRPD) data for the feature dot data clusters; and a partial discharge determination unit configured to recognize patterns of the PRPD data generated by the signal clustering unit to diagnose the signals and determine whether a partial discharge of the power device has occurred based on the diagnosis.

In addition, the feature dots may include shape parameters of pulses and bandwidths of the pulses into which the pulse waveforms are converted in a frequency domain.

Further, the signal clustering unit may cluster feature dot points on the two-dimensional feature dot data obtained from the signal separation unit on the basis of density corresponding to the number of feature dot points present within a preset radius with respect to a specific feature dot point.

In addition, the partial discharge determination unit may compare the PRPD data patterns and pulse waveforms of the signal clustering unit to learning data stored in a machine learning algorithm to diagnose the signal as one of a corona discharge signal, a noise signal, an internal discharge signal, and a surface discharge signal.

According to the partial discharge monitoring system and the partial discharge monitoring method according to the present disclosure, the machine learning algorithm applied to the main unit constituting the partial discharge monitoring system can quickly and accurately determine the occurrence of a partial discharge by pattern recognizing a unique signal according to a defect of the power device inside the power system, and the manual work of an operator for measuring the signal is unnecessary, so that the signal can be measured even in a dangerous area such as a buried area of a power cable or an underground cable, and the occurrence of a partial discharge can be monitored in real time.

BRIEF DESCRIPTION OF THE DRAWINGS

FIGS. 10 to 12 illustrate a process for amplifying PRPD data in the partial discharge determination step of the partial discharge monitoring method according to the present disclosure.

DETAILED DESCRIPTION

Figure 1:
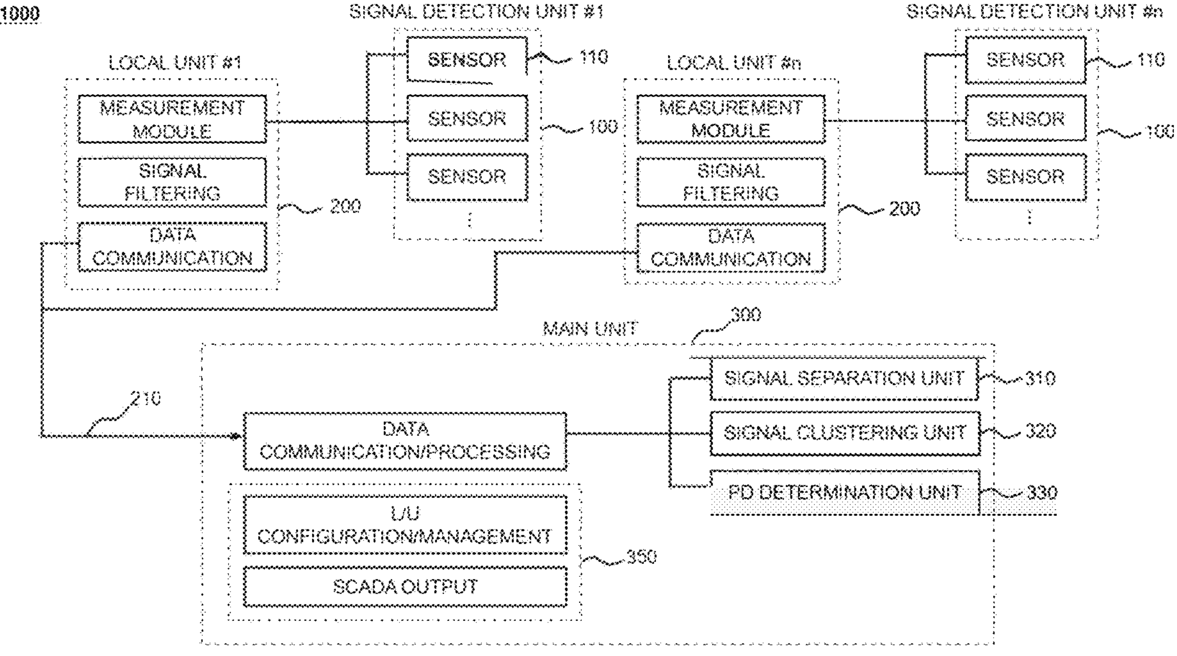
FIG. 1 illustrates an overall configuration view of a partial discharge monitoring system according to the present disclosure.

Hereinafter, exemplary embodiments of the present disclosure will be described in detail with reference to the accompanying drawings. However, the present disclosure is not limited to the exemplary embodiments to be described below and may be specified as other aspects. On the contrary, the embodiments introduced herein are provided to make the disclosed content thorough and complete, and sufficiently transfer the spirit of the present disclosure to those skilled in the art. Like reference numerals indicate like constituent elements throughout the specification.

Figure 2:
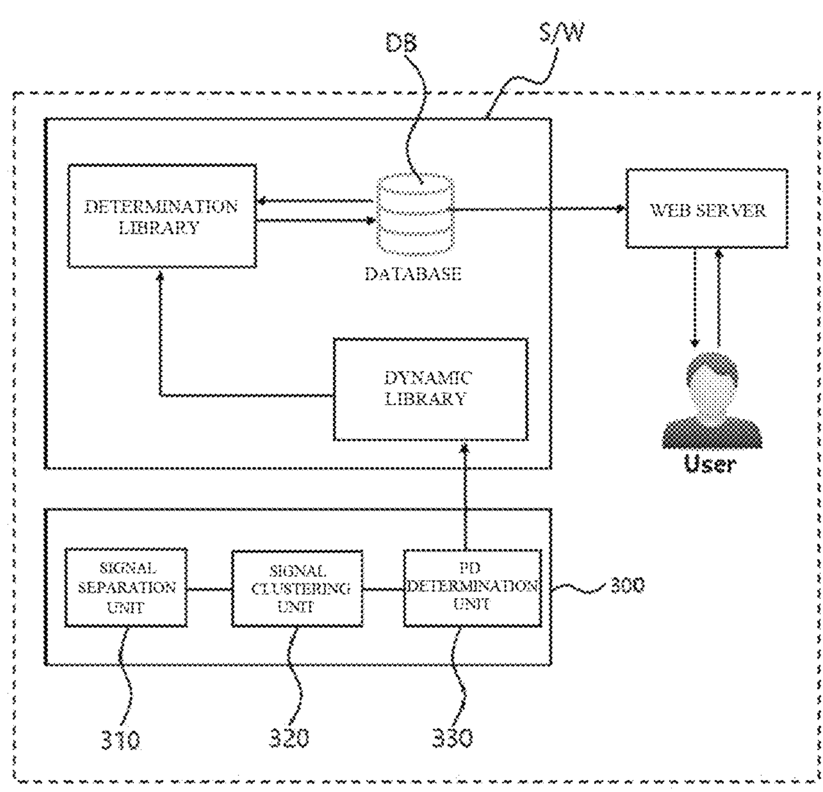
FIG. 2 illustrates a machine learning network in the partial discharge monitoring system according to the present disclosure.

FIG. 1 illustrates an overall configuration view of a partial discharge monitoring system according to the present disclosure, and FIG. 2 illustrates a machine learning network in the partial discharge monitoring system according to the present disclosure.

A partial discharge monitoring system (PDMS) 1000 according to the present disclosure is a system capable of automatically detecting and determining a partial discharge (PD), which is a discharge that occurs locally within a high-voltage power device before an insulator is destroyed and may cause major problems in a power system. The partial discharge includes a corona discharge, which occurs near a tip of an electrode, a surface discharge (or "creeping discharge"), which occurs along a surface of an insulator, an internal discharge, which is caused by foreign materials such as voids or dust inside the insulator, and the like and may include some noise signals.

As illustrated in FIG. 1 and FIG. 2, the partial discharge monitoring system 1000 according to the present disclosure applies a machine learning algorithm to monitor and measure state information on the power device inside the power system in real time, and transmits the results of the monitoring and measurement to a remote control room to provide information to a user.

The partial discharge monitoring system 1000 according to the present disclosure may be configured to include a signal detection unit 100 provided with a sensor that detects signals of a high-voltage power device, a local unit 200 configured to transmit the signals detected by the signal detection unit through a communication network, and a main unit 300 configured to extract feature dots from the signals transmitted through the local unit by applying a machine learning algorithm to generate two-dimensional feature dot data corresponding to the extracted feature dots, to classify the feature dots into feature dot data clusters by clustering the feature dots according to density, and to determine whether a partial discharge (PD) has occurred by recognizing patterns of PRPD data for the feature dot data clusters. Meanwhile, the signal here may include one or more of the corona discharge signal, the noise signal, the internal discharge signal, or the surface discharge signal.

The partial discharge monitoring system 1000 according to the present disclosure may quickly and accurately determine the occurrence of partial discharge by classifying and pattern recognizing unique signals according to a defect of the power device such as a power cable inside the power system by the machine learning algorithm applied to the main unit 300, and may measure the signals even in a dangerous area to monitor whether a partial discharge has occurred in real time because manual work by an operator for measuring the signals is unnecessary after pre-installation.

The signal detection unit 100 may include one of a CT sensor, an AE sensor, a TEV sensor, a UHF sensor, or a HFCT sensor, or: a plurality of signal detection sensors 110, preferably may be configured as a high frequency current transformer sensor (HFCT sensor) to measure a pulse waveform of a signal generated from the power device.

In one embodiment, the plurality of sensors 110 may measure signals generated inside a junction box, for example, an intermediate junction box, an end box in air (EBA) or an end box in gas (EBG), which connects power cables of a power system. The signals measured by the signal detection unit 100 may be transmitted to the local unit 200 through a plurality of sensor cables.

In the related art, since whether or not a partial discharge of a power device occurs is determined on the basis of a current phase of the power device or an AC voltage phase of a commercial power source, the partial discharge determination result is inaccurate due to a phase difference from the voltage phase of the power device, but in the partial discharge determination according to the present disclosure, a pattern of a signal may be determined through PRPD data accumulated and stored in a machine learning algorithm regardless of the phase difference.

That is, according to the present disclosure, the partial discharge determination may be made by a PRPD pattern using the current phase of the high-voltage power device or the voltage phase of the commercial power source, and the pattern of the signal may be recognized through the PRPD data accumulated and stored in the machine learning algorithm regardless of the phase difference from the voltage phase of the power device.

The local unit 200 may transmit the signals measured from the plurality of sensors 110 to the main unit 300 through a communication network. For example, the local unit 200 may perform amplification or frequency tuning operations and the like to easily separate the signals detected by the signal detection unit 100, and may convert the signals into optical signals and transmit the signals to the main unit 300 in a mobile communication network via a communication cable 210 in the form of an optical cable.

The main unit 300 may include a signal separation unit 310 that separates the signals transmitted from the local unit 200, a signal clustering unit 320 that clusters and classifies the separated signals, and a partial discharge determination unit 330 that diagnoses each of the classified signals and finally determines whether a partial discharge has occurred.

For example, the main unit 300 may be configured to include the signal separation unit 310 configured to extract feature dots from pulse waveforms of the signals transmitted through the local unit 200, and to generate two-dimensional feature dot data using the extracted feature dots, the signal clustering unit 320 configured to cluster similar feature dots on the two-dimensional feature dot data generated by the signal separation unit according to density and classify the similar feature dots into feature dot data clusters, and to generate PRPD data for the feature dot data clusters, and the partial discharge determination unit 330 configured to determine whether a partial discharge of the power device has occurred on the basis of a pattern of the PRPD data generated by the signal clustering unit.

The signal separation unit 310 constituting the main unit 300 may perform an operation of extracting a shape parameter of a pulse and a bandwidth of a pulse converted in the frequency domain among the feature dots of a pulse waveform of the signal, respectively, and generating two-dimensional feature dot data using the two extracted feature dots.

The signal clustering unit 320 constituting the main unit 300 may perform an operation of clustering feature dot points on the basis of density corresponding to the number of feature dot points present within a preset radius with respect to a specific feature dot point on the two-dimensional data generated by the signal separation unit 310.

The partial discharge determination unit 330 constituting the main unit 300 may perform an operation of determining similarity between patterns of PRPD data for feature dot data clusters obtained from the signal clustering unit 320 and learning data stored in the machine learning algorithm of the partial discharge determination unit 330 to diagnose the measured signal.

Here, when the signal transmitted from the local unit 200 is diagnosed as a corona discharge signal or a noise signal, the partial discharge determination unit 330 may diagnose the signal to be a normal signal and determine that no defect has occurred in the power device, and when the main unit 300 diagnoses the signal transmitted from the local unit 200 as an internal discharge signal or a surface discharge signal, the partial discharge determination unit 330 may diagnose the signal to be a partial discharge signal and determine that a defect has occurred in the power device.

Meanwhile, the signal transmitted from the local unit 200 may include a plurality of signals according to a measurement period, in which case, when the measured signals are separated and clustered, the signals may be classified into a plurality of feature dot data clusters, and the plurality of signals may be diagnosed as one of a corona discharge signal, a noise signal, an internal discharge signal, or a surface discharge signal, respectively, according g to patterns of PRPD data for the plurality of feature dot data clusters.

Hereinafter, details of the partial discharge monitoring method through the machine learning algorithm applied to the main unit 300 will be described below.

Each of the algorithms for performing operations of the signal separation unit 310, the signal clustering unit 320, and the partial discharge determination unit 330 that constitute the main unit 300 may be stored in a dynamic library, and each signal determined in the partial discharge determination unit 330 of the main unit 300 may be diagnosed to match an actually measured signal in a pre-learned determination library. Meanwhile, the algorithm applied to the partial discharge determination unit 330 is a machine learning algorithm.

Further, the control unit 350 may apply a supervisory control and data acquisition (SCADA) system to control the power of a process, equipment, or the like within the partial discharge monitoring system 1000.

In addition, the control unit 350 may be set and controlled to output the signal diagnosis results to a display screen for visual identification by a user, or to generate an alarm or warning message to the user when a partial discharge occurs in the power device.

Figure 3:
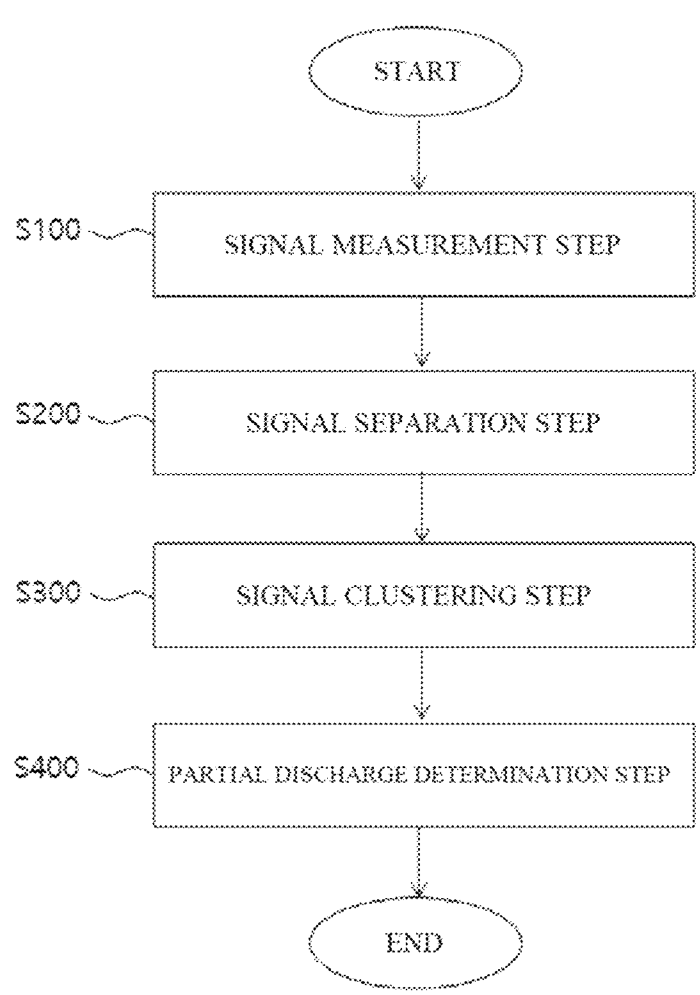
FIG. 3 illustrates a flowchart of the partial discharge monitoring method according to the present disclosure.

FIG. 3 illustrates a flowchart of the partial discharge monitoring method according to the present disclosure.

As illustrated in FIG. 3, the partial discharge monitoring method according to the present disclosure may include a signal measurement step (S100) of measuring signals of the high-voltage power device to obtain pulse waveforms of the signals, a signal separation step (S200) of extracting feature dots from the pulse waveforms, and generating two-dimensional feature dot data using the feature dots, a signal clustering step (S300) of clustering feature dot points on the two-dimensional feature dot data according to density to classify the feature dot points into feature dot data clusters, and obtaining phase resolved partial discharge (PRPD) data for the classified feature dot data clusters, and a partial discharge determination step (S400) of recognizing PRPD data patterns to diagnose the signals and, based on the diagnosis, determine whether a partial discharge of the power device has occurred.

FIG. 4A to FIG. 4C illustrate graphs of pulse waveforms with measured magnitudes of pulses for a noise signal, a corona discharge signal, and a surface discharge signal, respectively, measured over time in the signal measurement step of the partial discharge monitoring method according to the present disclosure.

Figure 4:
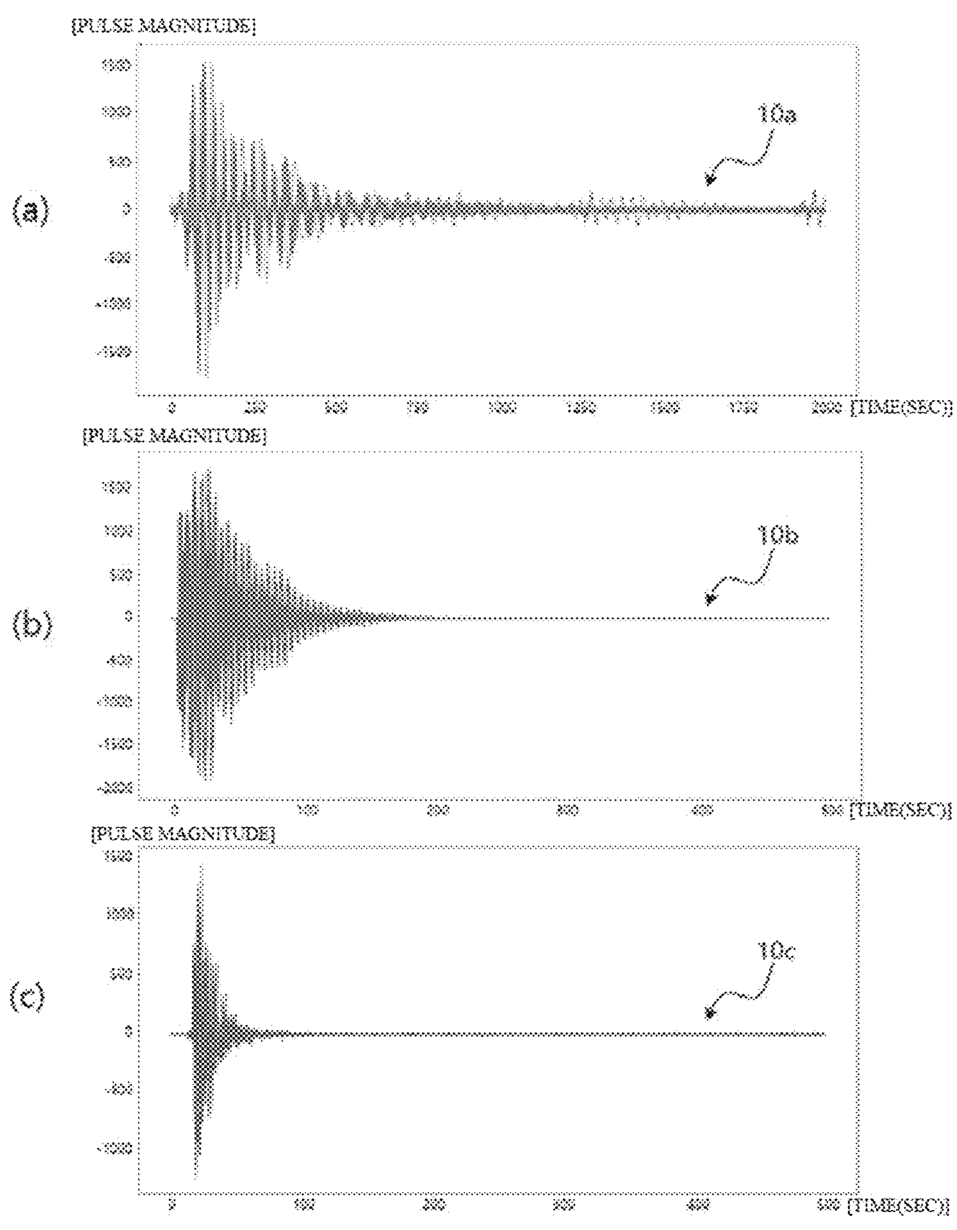
FIG. 4 illustrates graphs of pulse waveforms for a noise signal, a corona discharge signal, and a surface discharge signal measured in a signal measurement step of the partial discharge monitoring method according to the present disclosure, respectively.

As illustrated in FIG. 4, in the signal measurement step S100 of the partial discharge monitoring method according to the present disclosure, signals, such as the corona discharge signal, the surface discharge signal, the internal discharge signal, and the like, may be measured from the sensor 110 (see FIG. 1) provided in the high-voltage power device in the power system, and pulse waveforms 10*a*, 10*b*, and 10*c* thereof may be obtained.

In addition, the pulse waveforms 10 for the signals obtained in the signal measurement step S100 may be saved as a CSV (Comma Separated Values) file and subsequently used in the signal separation step S200. Here, visualization processing of the pulse waveforms 10 for the signals input as the CSV file may result in the graphs illustrated in FIG. 4. For example, FIG. 4A illustrates a pulse waveform 10*a* shown by overlapping a plurality of pulse waveforms obtained from the noise signal, FIG. 4B illustrates a pulse waveform 10*b* shown by overlapping a plurality of pulse waveforms obtained from the corona discharge signal, and FIG. 4C illustrates a pulse waveform 10*c* shown by overlapping a plurality of pulse waveforms obtained from the surface discharge signal.

Figure 5:
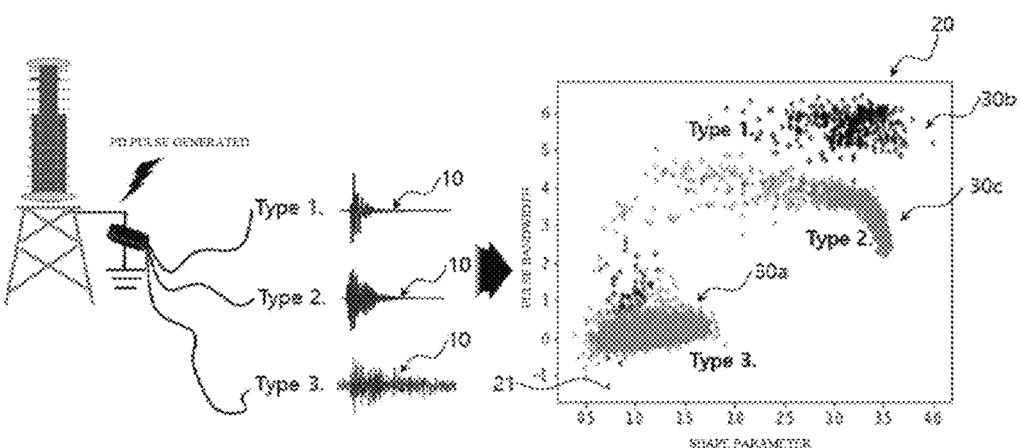
FIG. 5 illustrates two-dimensional feature dot data in which two feature dots are generated from a pulse waveform in a signal separation step of the partial discharge monitoring method according to the present disclosure.
Figure 6:
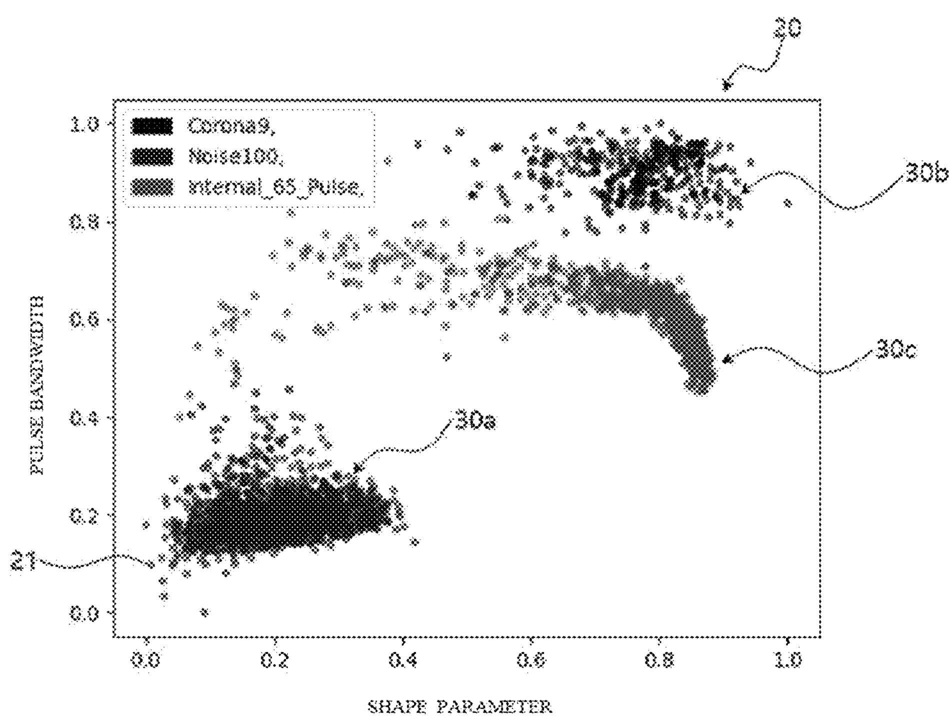
FIG. 6 illustrates two-dimensional feature dot data for which clustering has been completed in a signal clustering step of the partial discharge monitoring method according to the present disclosure.

FIG. 5 illustrates two-dimensional feature dot data in which two feature dots have been generated from a pulse waveform in the signal separation step S200 of the partial discharge monitoring method according to the present disclosure, and FIG. 6 illustrates two-dimensional feature dot data in which clustering has been completed in the signal clustering step S300 of the partial discharge monitoring method according to the present disclosure.

In the signal separation step S200 of the partial discharge monitoring method according to the present disclosure, in order to separate the signals from the tens of thousands of pulse waveforms 10 for the signals input in the signal measurement step S100, two feature dots are extracted from each of the pulse waveforms 10, and two-dimensional feature dot data 20 with the extracted two feature dots as the X-axis and the Y-axis may be generated.

Here, in the two-dimensional feature dot data 20 generated in the signal separation step S200, approximately 1000 or more pulse waveforms 10 may be mapped onto a two-dimensional plane using two feature dots extracted from the pulse waveforms 10 so that each pulse waveform 10 may be easily separated.

As illustrated in FIG. 5, each pulse waveform 10 is converted to a feature dot point 21 (one point) having an X-axis value and a Y-axis value, and the two-dimensional feature dot data 20 includes all of the converted feature dot points 21.

In the present disclosure, it was confirmed that in the process of selecting a plurality of feature dot candidates from the pulse waveforms 10 obtained in the signal measurement step S100, a shape parameter and a frequency component of the pulse transformed in the frequency (Hz) domain are most effective in facilitating separation of the respective signals when the pulse waveforms 10 are mapped onto the two-dimensional plane.

Specifically, the frequency component of the pulse that is extracted as a feature dot of the pulse waveform 10 is a bandwidth of the pulse that is converted in the frequency domain through the Fourier transform after the natural frequency of the pulse is calculated. In addition, the shape parameter of the pulse may be calculated using a shape of the pulse waveform 10 as a parameter.

Therefore, in the signal separation step S200, the shape parameters of the pulses and the bandwidths of the pulses, into which the pulse waveforms 10 obtained in the signal measurement step S100 are converted in the frequency domain, are calculated, and the calculation results are normalized to values between 0 and 1, which may generate the two-dimensional feature dot data 20 with the X-axis and the Y-axis, respectively.

As illustrated in FIG. 5, on the two-dimensional feature dot data 20 generated in the signal separation step S200, a feature dot data cluster 30*a* corresponding to the noise signal, a feature dot data cluster 30*b* corresponding to the corona discharge signal, and a feature dot data cluster 30*c* corresponding to the internal discharge signal are clustered in different areas on the two-dimensional area converted to the shape parameters and bandwidths of the pulses, so that separation of each signal may be easily performed. As illustrated in FIG. 6, in the signal clustering step S300, the two-dimensional feature dot data may finally be classified into the three feature dot data clusters 30*a*, 30*b*, and 30*c*, which may be displayed in different colors for user convenience.

Meanwhile, it can be seen that a separation algorithm applied in the signal separation step S200 takes only approximately 3.2 seconds to generate the two-dimensional feature dot data 20 with respect to the 100,000 pulse waveforms 10 input to the signal separation step S200, indicating that the signal separation operation of the signal separation step S200 is performed very quickly.

Figure 7:
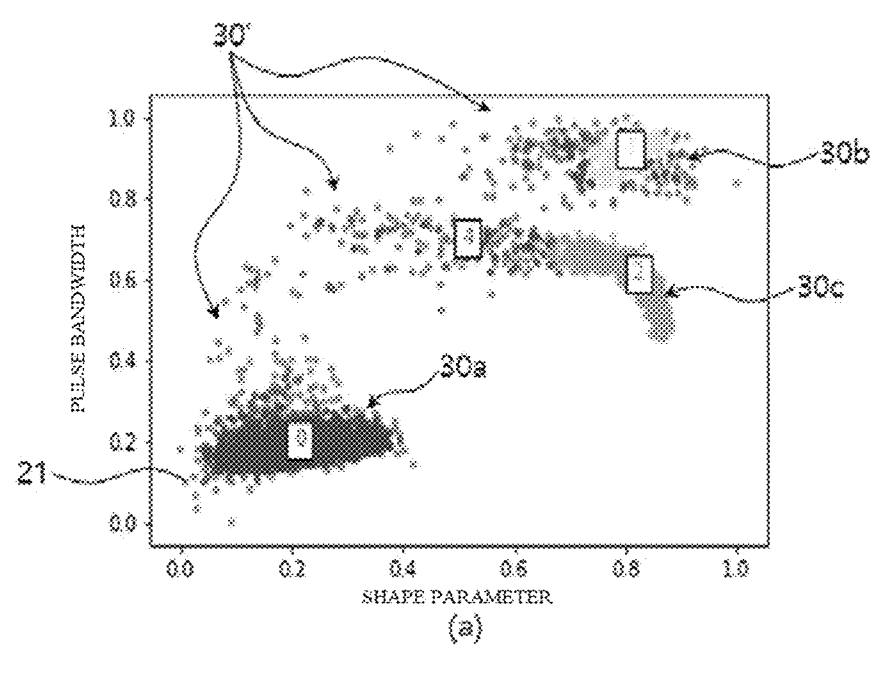
FIG. 7 illustrates a process of clustering on the basis of density on the two-dimensional feature dot data in the signal clustering step of the partial discharge monitoring method according to the present disclosure.
Figure 7:
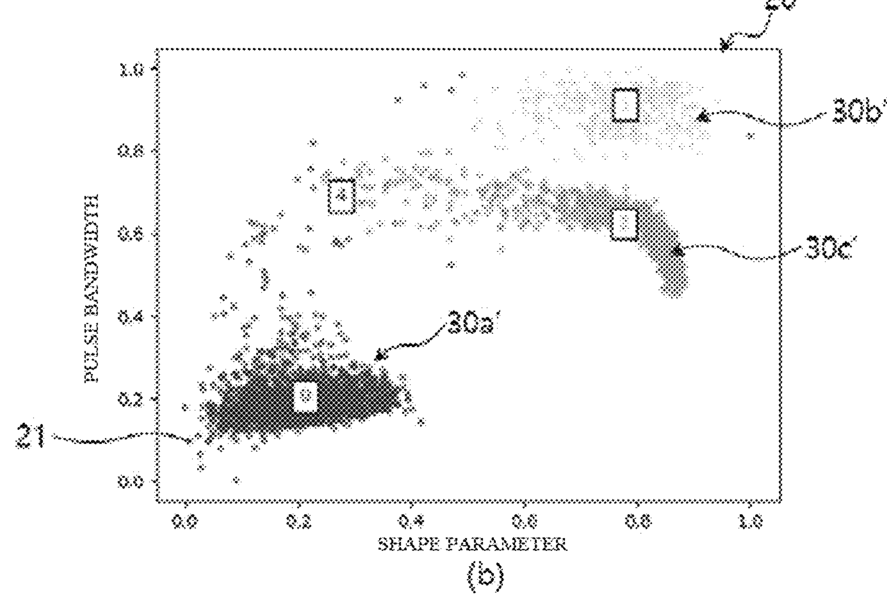

As illustrated in FIG. 7, in the signal clustering step S300 according to the present disclosure, a clustering algorithm performs an operation of clustering the feature dot points 21 on the two-dimensional feature dot data 20 generated in the signal separation step S200 according to density to classify the feature dot points 21 into different signals.

Further, the clustering algorithm of the signal clustering step S300 may cluster the feature dot data 21 in a relatively high-density area, as illustrated in FIG. 7A, using a method as described below.

In the signal clustering step S300, when a specific number of feature dot points 21 exist within a preset radius with respect to a specific feature dot point 21 in the two-dimensional feature dot data 20, the clustering process may be performed by considering the specific number of feature dot points 21 as a cluster. Since the clustering process is performed on the basis of density in the method as described above, there are advantages in that it is easy to find clusters of various geometric patterns other than circles on the two-dimensional signal data 20, and the clustering process may be performed smoothly even when the sizes of the feature dot data clusters are irregular.

Therefore, each of the pulse waveforms 10*a*, 10*b*, and 10*c* (see FIG. 4) on the two-dimensional feature point data 20 generated in the signal separation step S200 may be clustered into respective clusters, for example, a feature dot data cluster 30*a* corresponding to a noise signal, a feature dot data cluster 30*b* corresponding to a corona discharge signal, and a feature dot data cluster 30*c* corresponding to an internal discharge signal, by the clustering algorithm of the signal clustering step S300. Then, PRPD data for each of the signals corresponding to each of the feature point data clusters 30*a*, 30*b*, and 30*c* may be obtained.

The PRPD data means data obtained as a two-dimensional image that includes a PRPD pattern for each signal after obtaining two-dimensional matrix data indicating a phase angle, a magnitude of each signal corresponding to a plurality of feature dot data clusters 30, and the number of pulses of each signal, and performing a preprocessing of the obtained two-dimensional matrix data. Here, the phase may be the current phase of the power device or the voltage phase of the commercial power source, and the details of the preprocessing of the matrix data will be discussed below.

In the signal clustering step S300, the plurality of feature dot points 21 are included within the preset radius in case of a relatively high density on the two-dimensional feature dot data 20 so that a cluster may be easily formed. In contrast, there is a phenomenon that it is difficult to form a cluster when the number of the feature dot points 21 is small and thus the density is relatively low.

To compensate for the phenomenon as described above, the clustering algorithm in the signal clustering step S300 may apply a minimum spanning tree algorithm to facilitate the formation of localized clusters of the feature dot points 21 even in a low-density area, as illustrated in FIG. 7B.

With reference to FIG. 7A, it can be seen that the clustering algorithm in the signal clustering step S300 is unable to form clusters in a low-density clustering area 30' where the feature dot points 21 are relatively clustered in a small number. In contrast, in case of FIG. 7B, it can be seen that the clustering algorithm is able to form clusters smoothly even in the low-density area of the data.

It can be seen that the clustering algorithm applied in the signal clustering step S300 takes approximately 19.14 seconds to form a cluster in the high-density area and approximately 25.07 seconds to form a cluster in the low-density area on the two-dimensional feature dot data 20 with respect to 100,000 feature dot points 21, which enables the clustering process of the signal clustering step S300 to be very fast.

Figure 8:
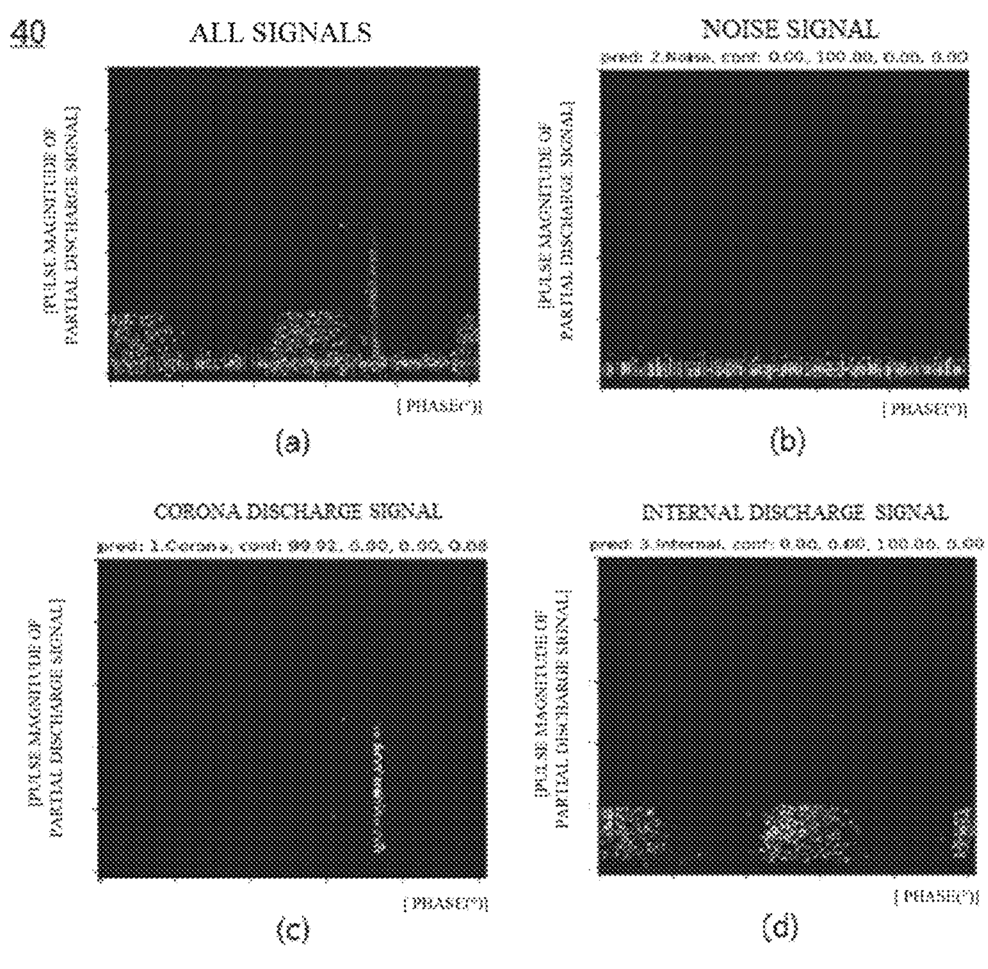
FIG. 8 illustrates a process of obtaining PRPD data for each signal per cluster in the signal clustering step of the partial discharge monitoring method according to the present disclosure.

FIG. 8 illustrates a process of obtaining PRPD data for each signal per cluster in the signal clustering step of the partial discharge monitoring method according to the present disclosure.

FIG. 8A illustrates PRPD data for signals measured in the power device in the signal measurement step S100, and FIG. 8B to FIG. 8D illustrate results of obtaining a plurality of PRPD data 40 by measuring magnitudes of signals according to a phase angle for signals corresponding to each of the feature dot data clusters 30*a*, 30*b*, and 30*c*, which are a noise signal, a corona discharge signal, and an internal discharge signal, in the signal clustering step S300.

In the partial discharge determination step S400 of the partial discharge monitoring method according to the present disclosure, PRPD data is input, and the patterns of the PRPD data based on the pulse magnitude and phase of the partial discharge signal may be analyzed to determine whether a partial discharge of the power device has occurred. For example, the pattern of the PRPD data may be compared with a PRPD pattern that has been stored and identified as a partial discharge signal and the pattern of the PRPD data may be determined to be a partial discharge signal when both are the same or similar. Here, the PRPD data input to the partial discharge determination step S400 is provided in a two-dimensional form, which is primarily used to determine the signal.

Meanwhile, in the partial discharge determination step S400, a pulse waveform may be further input for verification, and the pulse waveform may be analyzed to determine once more whether a partial discharge of the power device has occurred. Here, the input pulse waveform may be used as a supplementary resource in signal diagnosis.

Here, the partial discharge determination step S400 includes a process of preprocessing the PRPD data and the pulse waveform data. A machine learning-based diagnostic algorithm that is applied in the partial discharge determination step S400 may diagnose a type of signal measured in the signal measurement step S100 using the preprocessed PRPD data pattern and pulse waveform data.

Here, in the partial discharge determination step S400, the measured signal may be diagnosed as a normal signal when the measured signal is the noise signal or the corona discharge signal. In contrast, the measured signal may be diagnosed as a partial discharge signal when the measured signal is the internal discharge signal or the surface discharge signal, and it may be determined that a partial discharge has occurred in the power device.

Figure 9:
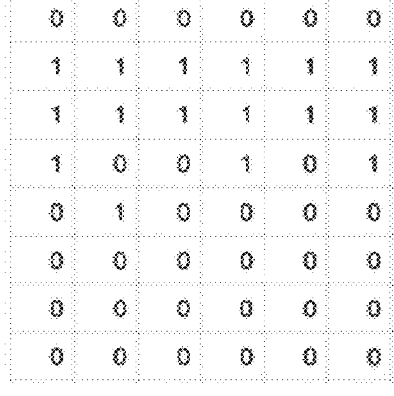
FIG. 9 illustrates a process of preprocessing PRPD data in the partial discharge determination step of the partial discharge monitoring method according to the present disclosure.
Figure 9:
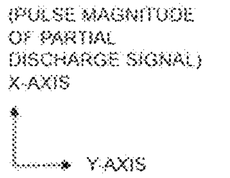

FIG. 9 illustrates a process of preprocessing PRPD data in the partial discharge determination step of the partial discharge monitoring method according to the present disclosure.

During the process of obtaining the PRPD data 40 in the partial discharge determination step S400, a preprocessing process may be performed to build a diagnostic algorithm that is not dependent on the measurement equipment or measurement method.

PRPD matrix data 43 illustrated in FIG. 9 represents a phase angle in the X-axis direction and a pulse magnitude of the signal in the Y-axis direction, and a value inside each cell means the number of times of pulse occurrence of the signal. Here, in the partial discharge determination step S400, the PRPD data 40 is inverted upside down and input depending on the variable settings of the PRPD measuring equipment, so the preprocessing process may be performed to convert the PRPD data 40 so that all of the PRPD data 40 are input in the same direction. In addition, a preprocessing process may be performed such that the value of each cell becomes 0 or 1 depending on whether the pulse has occurred or not, rather than an absolute value of the number of times of the pulse occurrence.

Figure 11:
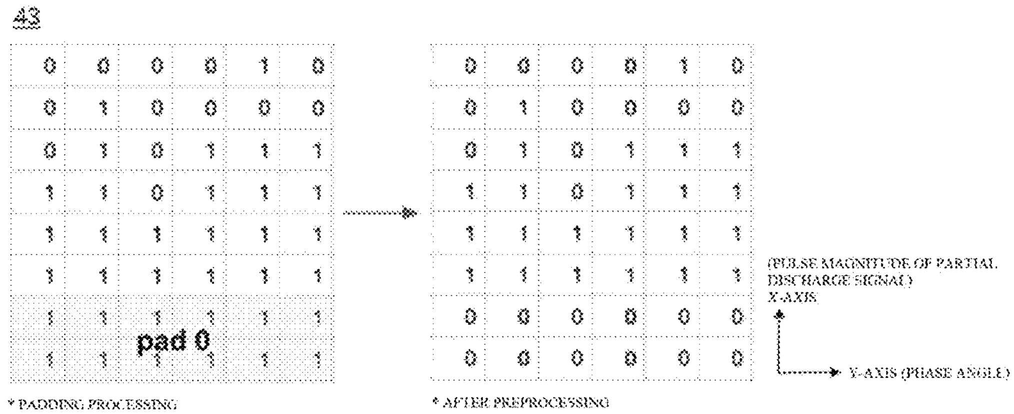
Figure 12:
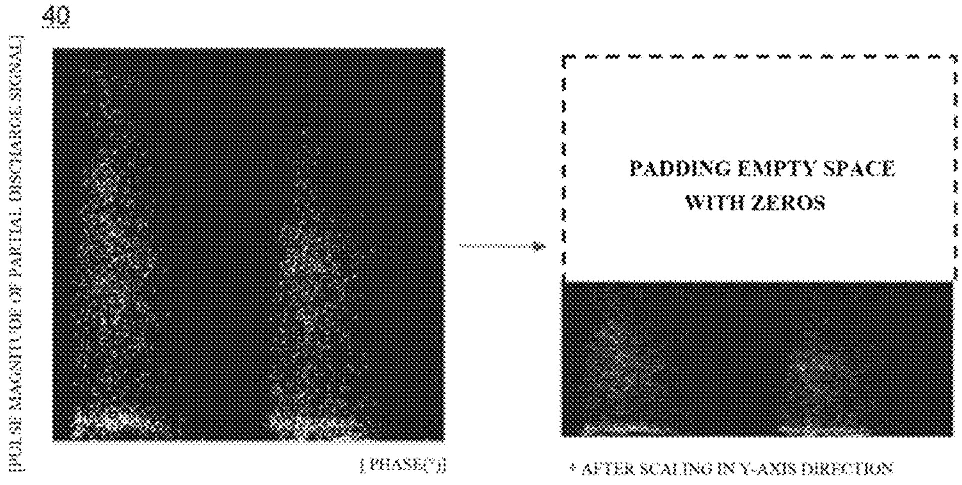

FIGS. 10 to 12 illustrate a process for amplifying the PRPD data in the partial discharge determination step S400 of the partial discharge monitoring method according to the present disclosure.

In the partial discharge determination step S400, a PRPD data amplification process may be performed, which is a process of artificially generating a variety of training datasets in order to build a robust diagnostic algorithm against various variables that may occur in actual data.

In the partial discharge determination step S400, the PRPD data amplification process may use a technique of left and right shifting the PRPD matrix data 43 along the X-axis direction to compensate for a phase difference in the PRPD data 40, a technique of padding the PRPD matrix data 43 along the Y-axis direction to remove noise in the PRPD data 40, a technique of changing a size in the PRPD data 40 along the Y-axis direction, and the like.

With reference to FIG. 10, in the PRPD data amplification process of the partial discharge determination step S400, multiple PRPD data may be generated by varying the phase change in the X-axis direction, and the entire data that is newly generated is analyzed by a machine learning algorithm. In one embodiment, the left and right shifting technique may be performed along the X-axis in the PRPD matrix data 43 with 256×256 cells. For example, the left and right shifting technique was performed by a method of moving the cell to the n-th column (where n is an integer from 0 to 128) in the 256×256 PRPD matrix data 43.

With reference to FIG. 11, in the PRPD data amplification process of the partial discharge determination step S400, the technique of padding some cells of the PRPD matrix data 43 along the Y-axis direction may be used to remove noise in the PRPD data 40. Specifically, in a process of collecting the PRPD data 40, signals having a magnitude less than a predetermined magnitude may not be measured in order to capture only signals excluding noise signals, in which case, the PRPD data amplification process may be performed using the padding technique of converting all values of cells in m rows (where m is an integer from 0 to 10) from the lowermost row of the PRPD matrix data 43 to zero (converting two rows to zero in FIG. 11). Through this data amplification process, determination may be easily achieved using the amplified data even when data with zeros in the m lowest rows is actually entered.

With reference to FIG. 12, in the PRPD data amplification process of the partial discharge determination step S400, a scaling technique may be used to change the size of the PRPD data 40 in the Y-axis direction.

Specifically, since the pattern of the signal in the PRPD data 40 is different in the Y-axis direction, it is necessary to obtain data with different sizes in the Y-axis. Therefore, the PRPD data 40 may be considered as an image and a scaling technique may be used, which is a technique that reduces or increases the size along the Y-axis direction and then converts or crops all remaining areas to zero to maintain the size of the existing PRPD data 40. In this case, an image size of the PRPD data 40 may increase or decrease by up to 50%, thereby amplifying PRPD data of various sizes.

Figure 13:
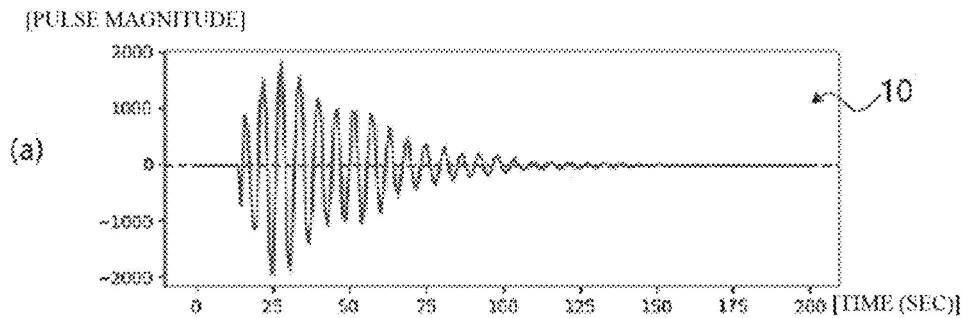
FIG. 13 illustrates results before and after feature dot points are amplified in the partial discharge determination step of the partial discharge monitoring method according to the present disclosure.
Figure 13:
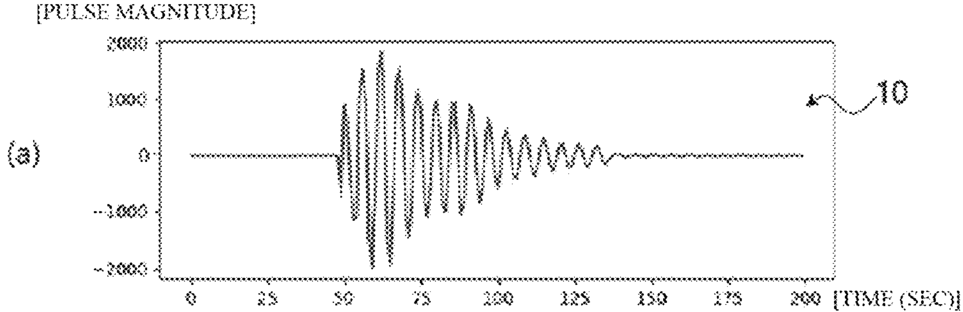

FIG. 13 illustrates results before and after the amplification of the pulse waveform data in the partial discharge determination step S400 of the partial discharge monitoring method according to the present disclosure.

FIG. 13A illustrates a state before the amplification of the pulse waveform data 10, and FIG. 13B illustrates a state after the amplification of the pulse waveform data 10.

In the pulse waveform data amplification process of the partial discharge determination step S400, a technique may be used to amplify the magnitude of the pulse by shifting the pulse waveform data 10 in the X-axis (time) direction in which the pulse waveform data 10 is input. That is, when the pattern of the pulse waveform data 10 is the same but a pulse start point is different, the diagnostic algorithm of the partial discharge determination step S400 may determine that the data are different, so the data may be amplified by changing the pulse start point.

Then, in the partial discharge determination step S400 of the partial discharge monitoring method according to the present disclosure, the diagnostic algorithm based on machine learning may be applied to diagnose whether a partial discharge has occurred by receiving the preprocessed or amplified PRPD data 40 and the pulse waveform data 10 as input, as described above.

Here, the diagnostic algorithm of the partial discharge determination step S400 may extract and recognize features appearing in the pattern of the PRPD data 40 using a convolutional neural network (CNN) and the like, and consequently determine the type of signal.

Figure 14:
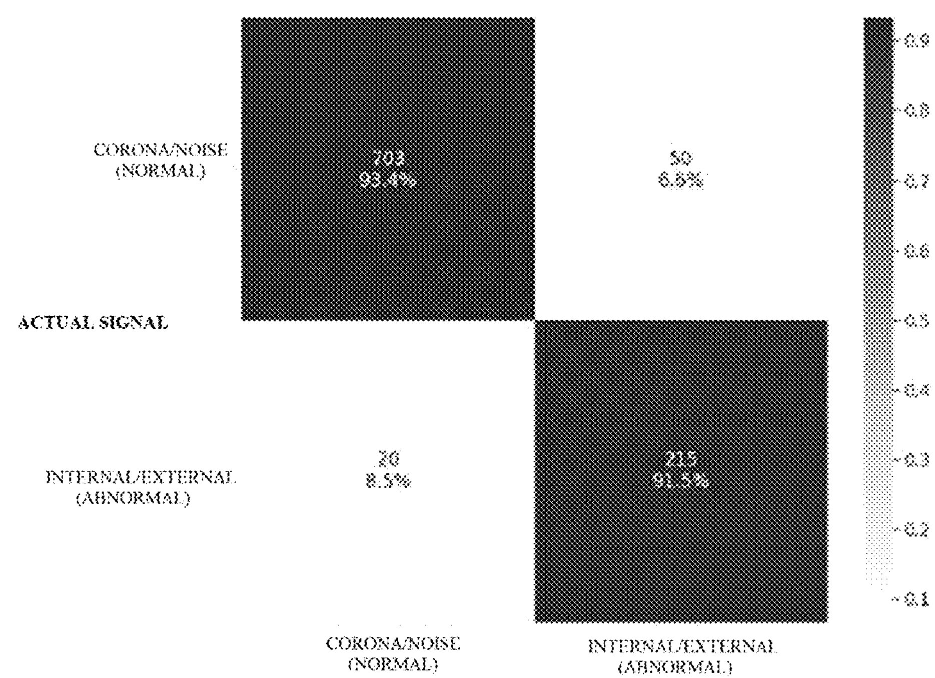
FIG. 14 illustrates a result of diagnosing a signal by recognizing a PRPD data pattern in the partial discharge determination step of the partial discharge monitoring method according to the present disclosure.

FIG. 14 illustrates a result of diagnosing the signal by recognizing a PRPD data pattern in the partial discharge determination step of the partial discharge monitoring method according to the present disclosure.

In the partial discharge determination step S400 of the partial discharge monitoring method according to the present disclosure, a type of each signal measured in the power device may be diagnosed by recognizing the PRPD data pattern using the diagnostic algorithm based on machine learning.

In other words, when the diagnostic algorithm of the partial discharge determination step S400 detects the signal generated by the power device as an abnormal signal, that is, an internal discharge signal or a surface discharge signal, it may be interpreted that a partial discharge has occurred in the corresponding power device.

As illustrated in FIG. 14, when the result determined by the diagnostic algorithm of the partial discharge determination step S400 is compared to the signal generated by the actual power device, it is found that the diagnostic algorithm of the partial discharge determination step S400 has a 93.4% probability of diagnosing an actual normal signal as a normal signal, and a 91.5% probability of diagnosing an actual abnormal signal as an abnormal signal when a partial discharge has actually occurred in the power device.

In contrast, it was found that the probability that the diagnostic algorithm of the partial discharge determination step S400 has a 8.5% probability of diagnosing a partial discharge signal as a normal signal even though a partial discharge has actually occurred in the power device, and the probability that the diagnostic algorithm of the partial discharge determination step S400 has a 6.6% probability of diagnosing a normal signal as a partial discharge signal even though no partial discharge has actually occurred in the power device, which may cause a cumbersome and unnecessary on-site response by an operator.

Further, the machine learning-based diagnostic algorithm applied in the partial discharge determination step S400 took approximately 2.5 seconds or less as a result of performing the signal diagnosis with respect to 10 or fewer PRPD data 40, and 2 seconds to 4 seconds as a result of performing the signal diagnosis with respect to 20,000 feature dot points 21, indicating that the diagnosis process is performed very quickly.

While the present disclosure has been described above with reference to the exemplary embodiments, it may be understood by those skilled in the art that the present disclosure may be variously modified and changed without departing from the spirit and scope of the present disclosure disclosed in the claims. Therefore, it should be understood that any modified embodiment that essentially includes the constituent elements of the claims of the present disclosure is included in the technical scope of the present disclosure.

The invention claimed is:

1. A partial discharge monitoring method comprising:

a signal measurement step of measuring signals of a high-voltage power device and obtaining pulse waveforms of the signals;

a signal separation step of extracting feature dots from the pulse waveforms and generating two-dimensional feature dot data using the feature dots;

a signal clustering step of clustering feature dot points corresponding to the feature dots on the two-dimensional feature dot data according to density to classify the feature dot points as feature dot data clusters, and obtaining phase resolved partial discharge (PRPD) data for the feature dot data clusters; and a partial discharge determination step diagnosing the signals by recognizing patterns of the PRPD data and determining whether a partial discharge of the high-voltage power device has occurred on a basis of a diagnosis result, wherein, in the signal clustering step, the feature dot points are clustered on a basis of density corresponding to a number of feature dot points present within a preset radius with respect to a specific feature dot point on the two-dimensional feature dot data obtained in the signal separation step.

2. The partial discharge monitoring method of claim 1, wherein the feature dots include shape parameters of pulses and bandwidths of the pulses into which the pulse waveforms are converted in a frequency domain.

3. The partial discharge monitoring method of claim 1, wherein, in the partial discharge determination step, a diagnosed signal is diagnosed as a normal signal when the diagnosed signal is a corona discharge signal or a noise signal, and the diagnosed signal is diagnosed as a partial discharge signal when the diagnosed signal is an internal discharge signal or a surface discharge signal to determine that the partial discharge has occurred due to a defect in the high-voltage power device.

4. A partial discharge monitoring system comprising:

a signal detection unit provided with a sensor to detect signals of a power device;

a local unit configured to transmit the signals detected by the signal detection unit through a communication network; and a main unit including:

a signal separation unit configured to extract feature dots from pulse waveforms of the signals transmitted through the local unit, and generate a two-dimensional feature dot using the extracted feature dots,;

a signal clustering unit configured to cluster feature dot points on two-dimensional feature dot data generated by the signal separation unit according to density to classify the feature dot points as feature dot data clusters, and generate phase resolved partial discharge (PRPD) data for the feature dot data clusters; and a partial discharge determination unit configured to recognize patterns of the PRPD data generated by the signal clustering unit to diagnose the signals to determine whether a partial discharge of the power device has occurred based on a diagnosis, wherein the signal clustering unit clusters feature dot points on the two-dimensional feature dot data obtained from the signal separation unit on a basis of density corresponding to a number of feature dot points present within a preset radius with respect to a specific feature dot point.

5. The partial discharge monitoring system of claim 4, wherein the feature dots include shape parameters of pulses and bandwidths of the pulses into which the pulse waveforms are converted in a frequency domain.

6. The partial discharge monitoring system of claim 4, wherein the partial discharge determination unit compares the PRPD data patterns and pulse waveforms of the signal clustering unit to learning data stored in a machine learning algorithm to diagnose the signals as one of a corona discharge signal, a noise signal, an internal discharge signal, and a surface discharge signal.

* * * * *